United States Patent [19]
Takahashi et al.
[11] 4,322,698
[45] Mar. 30, 1982

[54] LAMINATED ELECTRONIC PARTS AND PROCESS FOR MAKING THE SAME

[76] Inventors: Tetsuo Takahashi, 248-5, Shiogoshi, Kisagata-cho 4-chome, Yurigun, Akita-ken; Minoru Takaya, 13-2, Onitaka 3-chome, Ichikawa-shi, Chiba-ken, both of Japan

[21] Appl. No.: 107,742

[22] Filed: Dec. 27, 1979

[30] Foreign Application Priority Data

| | | | |
|---|---|---|---|
| Dec. 28, 1978 | [JP] | Japan | 53-161221 |
| Mar. 1, 1979 | [JP] | Japan | 54-22548 |
| Oct. 2, 1979 | [JP] | Japan | 54-126359 |
| Oct. 5, 1979 | [JP] | Japan | 54-127899 |

[51] Int. Cl.[3] .......... H03H 3/00; H03H 7/01; H01F 27/40; H01F 17/04

[52] U.S. Cl. .......... 333/184; 336/200; 336/232; 29/602 R

[58] Field of Search .......... 333/184–185, 333/139–140, 23; 29/25.42, 592 R, 602 R; 336/200, 232, 225, 208, 177, 192; 361/301-303, 306-308, 311-315, 320-322, 328

[56] References Cited

U.S. PATENT DOCUMENTS

| | | | |
|---|---|---|---|
| 3,785,046 | 1/1974 | Jennings | 29/602 |
| 3,798,059 | 3/1974 | Astle et al. | 29/602 |
| 3,812,442 | 5/1974 | Muckelroy | 29/602 |
| 4,048,593 | 9/1977 | Zillman | 333/185 X |

FOREIGN PATENT DOCUMENTS

| | | | |
|---|---|---|---|
| 919818 | 1/1973 | Canada | 333/185 |

OTHER PUBLICATIONS

Gillett–"Delay Line", IBM Technical Disclosure Bulletin, vol. 9, No. 3, Aug. 1966; pp. 266–267.

*Primary Examiner*—Marvin L. Nussbaum
*Attorney, Agent, or Firm*—Neuman, Williams, Anderson & Olson

[57] ABSTRACT

A chip-shaped laminated electronic part including at least one inductor, which comprises a plurality of sheets of an insulating material, and electrically conductive patterns each formed on the surface of each said sheets, said patterns being so connected to form one or more coils to provide at least one inductor. The electronic part is monolythic and is produced by using printing technique whereby wire-winding operation is eliminated.

10 Claims, 67 Drawing Figures

LAMINATED ELECTRONIC PARTS AND PROCESS FOR MAKING THE SAME

BACKGROUND OF THE INVENTION

The present invention relates to a laminated electronic part and a process for making the same. More particularly, the present invention relates to a laminated electronic element comprising laminated layers of an insulating material and printed patterns of a coil-forming electrically conductive material.

Existing inductors generally take the form of coils formed by winding insulated conductor wire around a magnetic core. The necessity of wire winding has limited the reduction in size of the inductors, despite the steady demand for microminiaturization of electronic components to keep pace with the development of microcircuitry. Moreover, the low fabrication efficiency has made the quantity production of inductors difficult.

Further, conventional composite electronic parts including as their element inductor or inductors such as a composite part including a capacitor and an inductor (a LC element), a composite part including two or more inductors (a transformer) have involved difficulties in compounding and microminiaturization, because of the relatively large size of the inductor and the utter difference in fabrication method between the inductor and the capacitor. In contrast to the marked progress being made in the development of thinner and smaller capacitors as typified by the laminated chip capacitors, difficulties have been encountered in the lamination and reduction in size of inductors due to the fact that their construction requires winding of conductive wire around a magnetic core. In the case of composite part including two or more inductors such as transformer, the fabrication has been done by using a magnetic core, in the shape of the letters E and I combined, E alone, or E and turned E combined and winding a pair of conductive wires around selected leg or legs of the magnetic core. The transformer thus requires an intricate winding process for fabrication and yet have problems such as largeness in size.

BRIEF SUMMARY OF THE INVENTION

Accordingly, a principal object of the present invention is to provide an electronic part including at least one inductor such as an induction coil, a transformer, a composite part such as an LC element, a filter elements, etc. which is easy to manufacture, is adapted to mass production, is compact in size and is capable of easily mounted on a circuit board.

Another object of the present invention is to provide an electronic part including at least one inductor which consists of laminated layers of insulating material and electrically conductive material and, in certain embodiments, further includes at least one capacitor, whereby said electronic part takes a chip form of small size.

A further object of the present invention is to provide a process for making a laminated electronic part of the above-mentioned nature.

Briefly, the electronic part according to the present invention comprises a plurality of insulating layers including insulating or insulated magnetic layers or dielectric layers and a plurality of electrically conductive layers in the from of a coil or coils, the two types of layers being alternatively laminated. The electronic part includes a single inductor in some embodiments, two or more inductors in other embodiments, and one or more inductors and one or more capacitors in further embodiments.

The laminated electronic part according to the present invention is manufactured by first forming an insulating sheet or layer of magnetic or dielectric material, and then forming a conductive pattern thereon, superposing another electrically insulating or electrically insulated magnetic sheet or layer, further forming a second conductive pattern thereon which is electrically connected to the first conductive pattern. These processes are repeated until a desired number of alternate layers are obtained. Finally, terminal thin electrodes are attached to two or more lateral edges of thusly formed laminated chip electronic part. In certain embodiments, the conductive patterns are so connected to form two or more inductors and, in other embodiments, the step of forming thin electrode or electrodes for incorporating capacitor in the electronic part is utilized.

BRIEF EXPLANATION OF THE DRAWINGS

FIG. 14 showing the first step of fabrication, FIG. 15 showing the second step; FIG. 16 the third step; FIG. 17 the fourth step, FIG. 18 the fifth step; FIG. 19 the sixth step; FIG. 20 the seventh step; FIG. 21 the eighth step; FIG. 22 the ninth step; FIG. 23 the tenth step, FIG. 24 the eleventh step, FIG. 25 being a plan view of the completed composite part, and FIG. 26 being an equivalent circuit diagram of the composite part;

FIG. 30 the third step; FIG. 31 the fourth step; FIG. 32 the fifth step; and FIG. 33 the sixth step;

FIGS. 37 to 43 being plan views; FIG. 44 development of the multilayer structure in an intermediate stage of fabrication; and FIG. 45 a perspective view of a complete LC composite electronic part of the invention.

DETAILED EXPLANATION OF THE INVENTION

In the practice of the invention, the insulator sheets to be used may consist of a magnetic material either insulating by nature or coated with an insulation or may, in some cases, be a dielectric material. They can be formed by varied procedures which are fundamentally the same. The powder of a magnetic material with or without an insulating property or the powder of a dielectric material is kneaded with an ordinary suitable binder, such as methyl cellulose or polyvinyl butyral, and a common suitable solvent to prepare a paste, and then the paste is extruded or spread by a doctor blade into sheets e.g., between a dozen and tens of microns thick (the method being hereinafter called "sheeting"). Alternatively, the paste may be formed into similar sheets by the printing method. In accordance with the invention, these sheets are laminated, by turns, with electrically conductive patterns, and the resulting laminate is sintered. The magnetic material to be employed is preferably a magnetic ferrite. Where the magnetic material is electrically conductive, the procedure may be modified so that the fabrication proceeds with the interposition of an insulator layer between the adjacent layers of the magnetic material. As for the dielectric material, an appropriate one may be chosen from among glass powder, alumina, barium titanate, titanium oxide, and the like.

The conductor to be used for forming the conductive patterns is a paste composed of the powder of an Ag-Pd (75:25-50:50) alloy, Pd, or other heat resistant metal and a binder. The conductor for forming the external connecting terminals may be the same conductive paste as mentioned immediately above or, where the terminals alone are to be attached and fired later, a similar paste of the powder of copper, silver, or the like may be used.

Although some embodiments of the present invention to be described below depend upon the printing technique for the formation of both insulator layers and conductive patterns, it is to be understood that the sheeting method is applicable as well.

Figure 1:
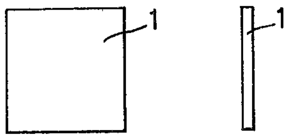
FIG. 1 shows the first step of fabricating a laminated inductor according to the first emboeiment of the present invention.
Figure 2:
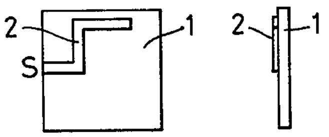
FIG. 2 shows the second step.
Figure 3:
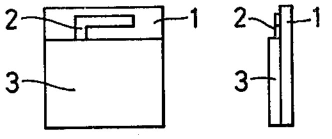
FIG. 3, the third step.
Figure 4:
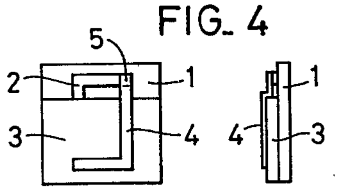
FIG. 4, the fourthe step.
Figure 5:
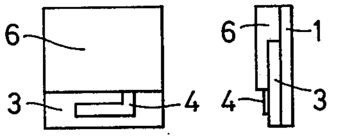
FIG. 5, the fifth step.
Figure 6:
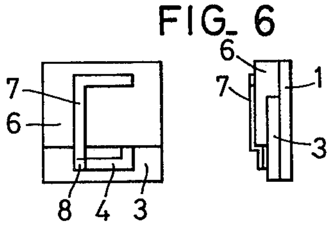
FIG. 6, the sixth step.
Figure 7:
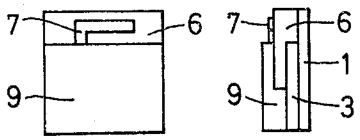
FIG. 7, the seventh step.
Figure 8:
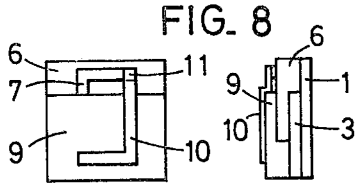
FIG. 8, the eighth step.
Figure 9:
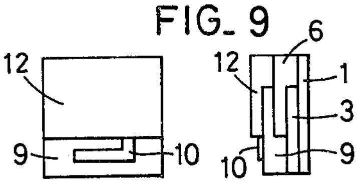
FIG. 9, the nineth step.
Figure 10:
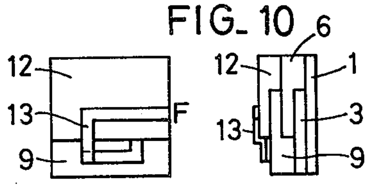
FIG. 10, the tenth step.
Figure 11:
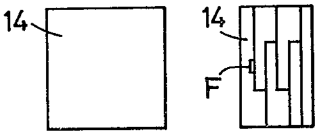
FIG. 11, the eleventh step.
Figure 12:
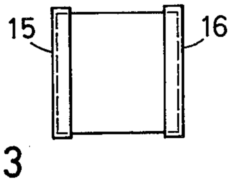
FIG. 12 is a plan view of the complete laminated inductor according to the invention.

FIGS. 1 through 13 illustrate the fabrication of a first embodiment of the laminated inductor of the invention and the product in the sequential stages of manufacture, in plane views of the left and in end views on the right. Referring first to FIG. 1, a flat surface of aluminum or the like is covered with a backing layer of polyester film (such as of Mylar, not shown), and then a magnetic material 1 composed of ferrite powder deposited by printing on the backing surface. Next, an insulator of glass powder is printed over the entire surface of the magnetic material 1. It is to be understood that, although not indicated by a reference numeral, the insulator is always disposed between the magnetic material and the electrically conductive material applied in a pattern thereon. Thus, mere reference to the magnetic material in this embodiment by a numeral should be regarded as implying the presence of an insulation layer between the magnetic material and the conductive pattern to be formed thereon. In FIG. 2, a conductive pattern 2 having a terminal S at an edge of the magnetic material 1 provided with the insulation layer is printed on the material 1. Next, another insulator layer is printed to cover the lower half of the conductive pattern and another magnetic material layer 3 is printed, followed by the printing of still another insulation layer, on the same area. As FIG. 4 indicates, a conductive pattern 4 is printed in the form of a "turned L" over the magnetic material 3 having the insulation layer, the upper end of the letter overlapping the terminal-free end of the pattern 2. In this way the conductive patterns 2 and 4 are electrically connected at the overlap 5. FIG. 5 shows that an insulation layer is printed this time to cover the upper half of the conductive pattern 4, and additional layers of magnetic material 6 and insulator are printed on the same surface. Next, as in FIG. 6, a conductive pattern 7 is printed in the form of an "inverted L" on the magnetic material 6 having the insulation layer so as to overlap the exposed end of the conductive pattern 4. The resulting overlap 8 naturally connects the patterns 4 and 7 electrically. Extending the description to FIG. 7, a further insulation layer, magnetic material 9, and insulation layer are printed, in the order of application, in the same manner as already described in conjunction with FIG. 3. Then, as in FIG. 8, a conductive pattern 10 is printed and electrically connected with the pattern 7 at the overlap 11, and further, as in FIG. 9, an insulation layer, magnetic material 12, and yet another insulation layer are printed, in the order mentioned. Finally, a conductive pattern 13 having a lead terminal F is printed as indicated in FIG. 10. Where necessary, another insulation layer and magnetic material 14 are printed as in FIG. 11. It will be seen that the terminal conductors S and F are exposed at the opposite edges of the laminate thus obtained (FIG. 11). The laminate is placed in a sintering furnace and is treated at the temperature and for the period of time necessary for the sintering of the particular magnetic material (ferrite). On the edge faces of the laminated inductor so obtained with the terminals S and F exposed, the same electriclly conductive paste as used in forming the conductive patterns is applied and is fired at a suitable temperature to provide outer terminals 15, 16 (FIG. 12). As an alternative, the outer terminals may be provided before the sintering.

In the embodiment of laminating inductor being described, the conductive patterns 2, 4, 7, 10, and 13 combinedly form a spiral. Because of the insulation layer interposed between itself and each conductive pattern thereon, the magnetic material may be chosen from among ferrites of good magnetic properties even with low electric resistances. In addition, the embodiment provides a magnetic path through the spiral of conductive patterns, as formed of the magnetic material outside of the patterns, and therefore the magnetic flux circulating through the path is kept from leaking to the outside. This is another factor contributory to improved characteristics of the inductor according to the invention.

Figure 13:
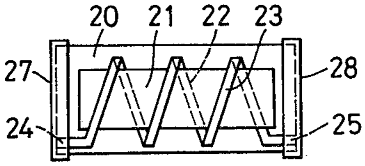
FIG. 13 is a view of the second embodiment of the laminated inductor of the invention in an intermediate stage of fabrication.

FIG. 13 shows another embodiment of the invention. A magnetic material 20 having an insulation layer on the surface is first printed with leftwardly tilted conductive patterns 22 at regular intervals (three such patterns being formed in the embodiment shown). at the same time; a terminal conductor 25 is printed, too. Next, a magnetic material 21 is printed in such a way as to prevent it from overlapping the upper and lower ends of the tilted patterns 22. Rightwardly tilted conductive patterns 23 are then printed so that they overlap the both ends of the patterns 22. In this way a flat spiral of conductive patterns is formed aroung the magnetic material 21. The numeral 24 designates another terminal. If necessary, an insulator of the same size as the magnetic material may be printed thereon, followed by further printing of the magnetic material. Lastly, outer terminals 27, 28 to make contact with the terminals 24, 25, respectively, are provided by printing or other technique. The assembly is heat treated by a sintering furnace to give a final laminated inductor.

This embodiment is not dissimilar to the first embodiment in the function and effect achievable, but it differs from the first in that the direction of the path of magnetic flux is planer. It will also be obvious that the inductor is of a closed magnetic circuit construction.

The first and the second embodiments utilized separate glass layers for insulating the magnetic layers. However, it should be noted that if the magnetic material is selected from an electrical insulator such as magnetic ferrite having a very high resistance, the printing of glass or other insulating layers can be omitted.

FIGS. 14 through 26 illustrate the third embodiment of the present invention which is a laminated chip-shaped LC composite part.

Figure 14:
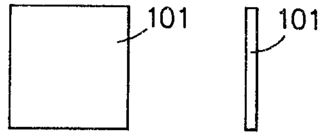
FIGS. 14 through 26 are a series of views illustrating the construction and sequence of fabrication of the third embodiment of composite part of the invention.
Figure 15:
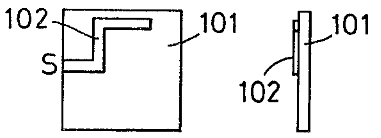
Figure 16:
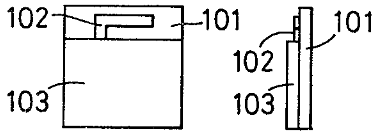
Figure 17:
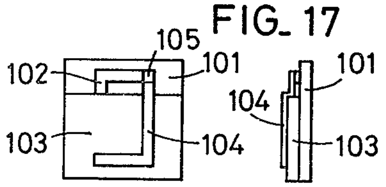
Figure 18:
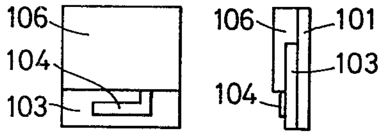
Figure 19:
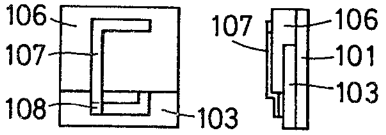
Figure 20:
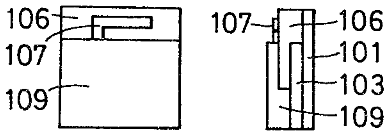
Figure 21:
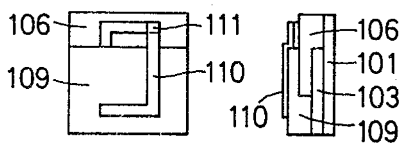
Figure 22:
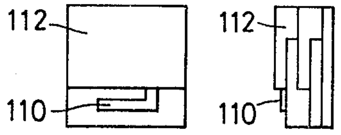
Figure 23:
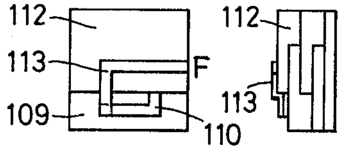
Figure 24:
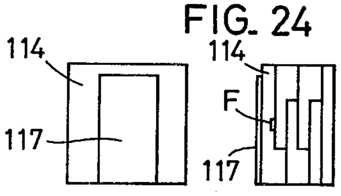
Figure 25:
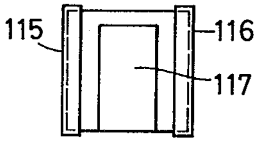

These figures show the process for fabrication of the chip-shaped composite part in a sequence of steps, in plan views on the left and in end views on the right. Referring first to FIG. 14, a flat surface of aluminum or the like (not shown) is covered with a backing layer, such as of polyester film (e.g., of Mylar, not shown), and then an insulating ferrite powder paste is deposited by printing on the backing surface to provide a sheet or layer of magnetic material 101. Thus, the magnetic material should hereinafter be construed to be insulating. Next, as shown in FIG. 15, a pattern 102 of an electrically conductive material having a terminal S at an edge of the magnetic material 101 is printed to a crank shape. The fabrication proceeds to the step of FIG. 16, where another layer of magnetic material 103 is printed to cover the lower half of the conductive pattern 102. As indicated in FIG. 17 another conductive pattern 104 is printed in the form of a "turned L" over the magnetic material 103, the upper end of the letter L overlapping one exposed end of the pattern 102. In this way the conductive patterns 102 and 104 are electrically connected at the overlap 105. In FIG. 18, another magnetic layer 106 is printed now to cover the upper half of the conductive pattern 104. Next, in the step of FIG. 19, a conductive pattern 107 is printed in the form of an "inverted L" on the magnetic material 106 so as to overlap the exposed end of the conductive pattern 104. Thus, the resulting overlap 108 connects the patterns 104 and 107 electrically. Extending the description to FIG. 20, a further layer of magnetic material 109 is printed in the same manner as illustrated in FIG. 16, followed by printing of a conductive pattern 110, as shown in FIG. 21, in electrical connection therewith at an overlap 111. Still another magnetic material layer 112, indicated in FIG. 22, is printed. Next, as in FIG. 23, a conductive pattern 113 having a terminal F is printed and, as in FIG. 24, a final magnetic material layer 114 is printed over the entire surface. Lastly, a layer of conductor 117 is printed over a broad area for capacity. It can be seen (from the right hand view of FIG. 24) that the terminal conductor F is exposed to the right edge of the resulting laminate, opposite to the edge where there is the terminal conductor S. It can also be seen that the lower end of the conductive pattern 117 is exposed to the lower edge of the multilayer structure. As will be obvious from the foregoing description, the conductive patterns 102, 104, 107, 110 and 113 combinedly form a spiral coil and they provide a capacity between themselves and the conductive pattern 117. Where necessary, an additional insulating layer (which is either magnetic or dielectric) may be printed. The laminate is then placed in a sintering furnace and is treated at the temperature and for the period of time necessary for the sintering of the particular magnetic material (ferrite). On the edge faces of the resulting sintered body which have the terminals S and F exposed (and, if necessary, also on the edge face where the conductive pattern 117 is exposed), an electrically conductive paste (e.g., of silver) is applied and is fired at a suitable temperature to provide terminals 115, 116 for external connections (FIG. 25). As an alternative, the external terminals may be added before the sintering.

Figure 26:
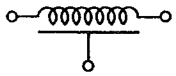

FIG. 25 is an outside view of a composite part thus obtained, and apparently a circuit electrically equivalent to the circuit of this part is as represented in FIG. 26. The composite part of the invention as embodied here has applications as LC composite parts, e.g., low-pass filters and component elements of delay lines. The embodiment can be microminiaturized by taking the advantage of printed circuit technology. In addition, because a number of elements can be simultaneously fabricated on a single polyester film, the product is suited for mass production and is assured of uniformity in quality. The part according to the invention, with the external connecting terminals exposed at the both side edges (sometimes at the lower edge, too) of the chip, can be readily mounted on a printed circuit board or other substrate. This is another factor contributory to the ease of fabrication work. It should be appreciated that the number of layers of the magnetic material as well as of the conductive patterns may be adjusted as desired.

Figure 27:
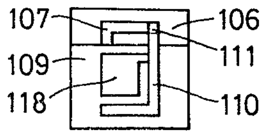
FIG. 27 is a plan view of the fourth embodiment of composite part in one stage of fabrication

FIG. 27 illustrates the fourth embodiment of the invention, which is a modification of the third embodiment with an increased capacity. The sequence of fabrication up to the stage shown in FIG. 15 is the same as that already illustrated and described, and therefore only the additional, distinct feature of the modified structure is shown in a plan view. Of the process steps shown in FIGS. 14 through 25, the step in FIG. 21 has already been described as printing the conductive pattern 110 on the magnetic material 109. In this fourth embodiment, a flat, capacity-providing conductive pattern 118 is additionally printed at the same time, as connected partly to the pattern 110. Consequently, the multilayer chip-shaped composite part so obtained has a greater capacity than the one made by the steps of FIGS. 14 through 25.

Figure 28:
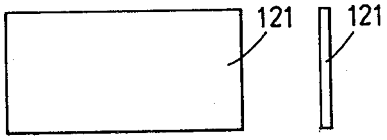
FIGS. 28 to 33 are a series of views illustrating the construction and sequence of fabrication of the fifth embodiment of composite part, FIG. 28 showing the first step of fabrication, FIG. 29 the second step.

FIGS. 28 to 33 show the fifth embodiment of the invention in a sequence of fabrication steps, in plan views on the left and in side views on the right. In FIG. 28, a thin sheet of ferrite as a magnetic material 121 is affixed by the printing technique to a polyester film (the magnetic material in this embodiment too being an insulator).

Figure 29:
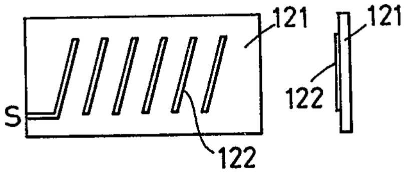

Following this, as indicated in FIG. 29, a plurality of straight conductive lines 122 are deposited by printing, obliquely at regular intervals, on the magnetic material 121. The lines of conductor 122 may be formed of a paste e.g., of a Pd-Ag alloy powder. As shown, they take the form of a starting terminal S and an array of rightwardly tilted straight lines spaced equidistantly apart. These conductor lines constitute back side conductor portions.

Figure 30:
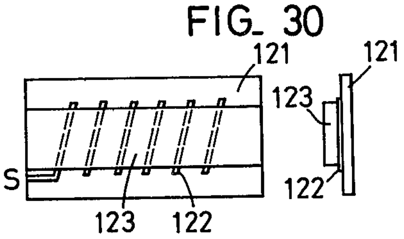

Next, as shown in FIG. 30, a band of magnetic material 113 is formed by printing across the conductor lines 122, leaving only their uper and lower ends exposed. This magnetic band serves as a magnetic core.

Figure 31:
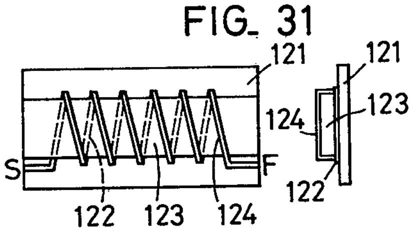

Referring then to FIG. 31, this time a plurality of leftwardly tilted lines of conductor 124 are printed in such a manner that each line, extending aslant, connects two corresponding back side conductor lines/22 at the opposite ends exposed. It will be seen that the two arrays of oppositely tilted conductor lines 122 and 124 on the back and front sides are thus joined to form a spiral coil around the magnetic material 123. The conductor line 124 at the right end of the front side array is extended rightward to provide a terminal F.

Figure 32:
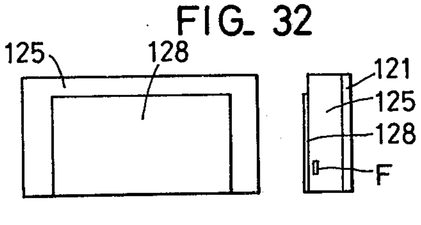
Figure 33:
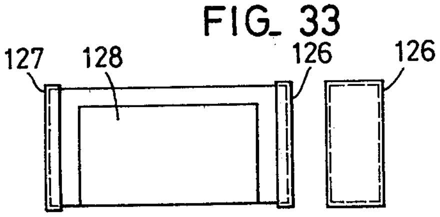

In FIG. 32, a layer of magnetic material 125 is printed over the conductor lines 124 on the front side, leaving only the terminals S and F exposed. Then, a capacity-providing conductor pattern 128 is printed over a broad surface area.

Following the step of FIG. 32, the multilayer structure thus fabricated is treated at the temperature and for the period of time necessary for sintering the particular ferrite. Finally, as in FIG. 33, external terminals 126, 127 are applied for connection to the terminals F and S and then are fired to complete this embodiment of composite part.

It is obvious that the resulting multilayer chip-shaped composite part embodying the invention has an equivalent circuit similar to the one illustrated in FIG. 26. The conductor 128, which serves as a common electrode, provides a capacity between the conductors 122 and 124.

Figure 34:
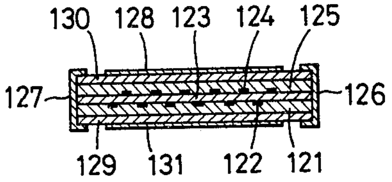
FIG. 34 is a sectional view of the sixth embodiment of composite part of the invention.
Figure 35:
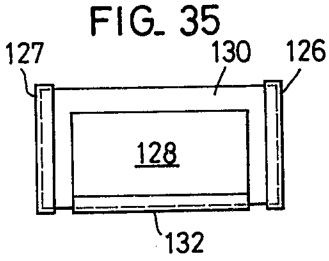
FIG. 35 is a plan view of the composite part.
Figure 36:
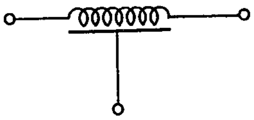
FIG. 36 is an equivalent circuit diagram of the composite part.

FIGS. 34 and 35 show the sixth embodiment of the invention. This is a modification for a greater capacity of the embodiment described above in connection with FIGS. 28 through 33. Those preceding figures and related description of the steps, together with the same reference numerals apply also to this embodiment. As shown in FIG. 34, a polyester film (not shown) is printed with a conductor 131 prior to the step of FIG. 28. The conductor 131 is of the same contour as the conductor pattern 128 of FIG. 33, with its lower end made to align with the lower edges of the layers to be deposited in the subsequent steps. Next, a dielectric layer 129 is printed. This layer 129 is formed to have the same surface area as the magnetic material 121. Over this layer, following the same sequence of steps as illustrated in FIGS. 28 to 31, the magnetic material 121 conductor 122, magnetic material 123, conductor 124, and magnetic material 125 are printed in the order mentioned. Then prior to the printing of the conductor 128, another layer of dielectric material 130 (FIG. 33) is printed, and lastly the conductor 128 is printed. The resulting multilayer structure is treated in a sintering furnace and, as shown in FIGS. 34 and 35, external connecting terminals 126 and 127 are attached and fired. Similarly, another external terminal 132 is provided between the conductor layers 128 and 131 exposed at the lower end of the structure. In this manner the embodiment of the composite part is completed. The equivalent circuit of this composite part is represented in FIG. 36.

The fifth and sixth embodiments of the invention have advantages, similar to those offered by the third and the fourth, in that the magnetic resistance is little because the magnetic path is directed along the plane of the magnetic material, and that the conductor lines 122, 124, sandwiched between the magnetic material layers, constitute a closed magnetic circuit and hence provide a large inductance. The sixth embodiment has an even greater capacity than the fifth embodiment.

FIGS. 37 through 46 illustrate the seventh embodiment of the present invention. This embodiment provides a very small LC laminated composite electronic part and a process for making the same.

Figure 37:
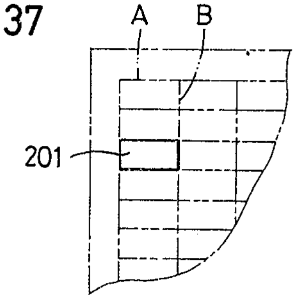
FIGS. 37 through 45 are a series of views illustrating the sequence of fabrication of an LC composite electronic part according to the seventh embodiment of the invention.
Figure 38:
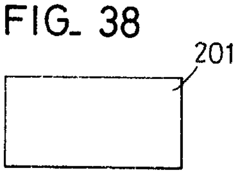
Figure 41:
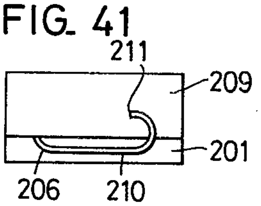
Figure 42:
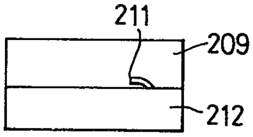

FIG. 37 illustrates the first step of fabrication of a composite electronic part embodying the invention. To begin with, an insulator layer of a wide surface area is formed by sheeting or printing on a proper flat substrate (not shown). The insulating material should be appropriately chosen so that a magnetic material is used where a higher value of inductance L is to be attained or a dielectric material where an increased capacitance C is desired. The same applies to the other insulator layers to be described later in connection with this embodiment. The lines A and B in FIG. 37 are imaginary ones extending across to divide the surface into sections 201, each constituting the lowermost layer on which a single composite part is to be built up. For the sake of simplification, the following description is confined to the fabrication over one such section, but it is to be understood that actually a plurality of parts are parallelly and simultaneously fabricated. FIG. 38 is an enlarged view of such a section of insulator layer 201 shown in FIG. 37. Extending the description to the step shown in FIG. 39, a conductive pattern 202 constituting a part of a coil and an electrode layer 203 are deposited in parallel by printing on the insulator 201. The conductive pattern 202 includes an end portion 204 exposed to the right hand edge of the insulator layer 201, a straight portion 205 extending leftward from the end portion, and a hooked portion 206. On the other hand, the electrode layer 208 includes a straight portion 207 extending closely adjacent to, and in parallel with, the straight portion 205 of the pattern 202, and a lead portion 208 branched upward from a middle point of the straight portion and exposed to the upper edge of the insulator layer 201. The side-by-side extension of the straight portions 205 and 207, spaced a short predeterminded distance apart, naturally provides capacitance between the two. These straight portions may be arcuately shaped instead provided they extend relatively long, close to each other in parallel. In the following step of FIG. 40, a somewhat narrow insulator layer 209 is formed by printing or sheeting over the insulator layer 201 in such a manner as to leave the end of the hooked portion 206 of the coil-forming conductive pattern uncovered. In FIG. 41, a conductive pattern 210 for coiling is formed as connected to the end of the hooked portion 206 of the underlying pattern. A part of this conductive pattern 210 has an end of hooked portion 211 extended over the insulator layer 209. As shown in FIG. 42, a somewhat narrow insulator layer 212 is formed by printing or sheeting over the insulator layers 201, 209, leaving the hooked end 211 of the conductive pattern exposed. Then as in FIG. 43, another coil-forming conductive pattern 213, connected at the straight end with the hooked end 211 of the underlying pattern, and an electrode layer 215 are printed closely in parallel, with a lead portion 216 extended from a middle point of the electrode layer to the upper edge of the laminate. The procedure so far described is repeated the number of times desired to build up an objective multilayer coil capacitor structure (yet to be sintered). Thus, the conductive patterns 202, 210, 213 and so forth for coiling are printed, while being connected end to end between the successive insulator layers until, as a whole, they complete a coil or inductance, and likewise the electrode layers 203, 215, and so forth directly provide a capacitance between themselves and the coil of conductive patterns. Although the embodiment being described has the electrode layers 203, 215 formed, one for each, on the complete pattern-insulator layer, it is alternatively possible to form the electrode layer on every other or every third complete layer, whichever necessary, to obtain a desired capacitance.

Figure 45:
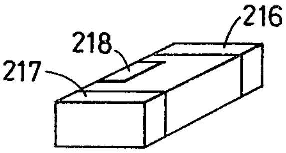

FIG. 44 gives different views of a laminate as an intermediate product fabricated by the foregoing sequence of steps and sectioned by the lines A and B as already explained in connection with FIG. 37. In the figure (A) is a top view of the multilayer structure covered on the surface by the insulator (the bottom of the structure looking the same), (B) is a rear view, showing lead portions 208 of the electrode layers forming a terminal of capacitor exposed to the back side of the laminate, (C) is a front view, and (D), (E) are left and right edge faces, respectively, of the multilayer structure, with the both ends 204, 204' of the coil exposed to the opposite edge faces of the structure. The laminate of FIG. 44 is placed in a sintering furnace and fired at a suitable temperature, e.g., at 1000° C., to sinter the insulator, such as a dielectric or magnetic material. The treatment converts the laminate to an integral unit in the form of a solid electronic part. Following this, as shown in FIG. 45, a silver paste or the like is applied on the left and right edge faces and nearby portions and also on and about the upper edge face of the sintered laminate and fired to form terminal electrodes 216, 217, 218, thus completing an LC composite electronic part according to the invention.

Figure 39:
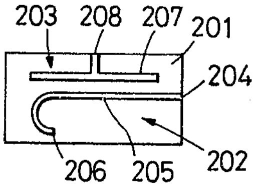
Figure 40:
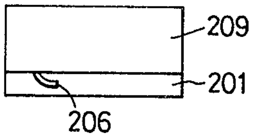
Figure 43:
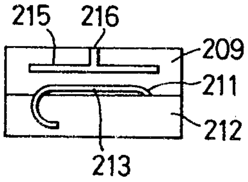
Figure 44B:
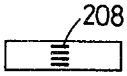
Figure 44D:
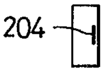
Figure 44A:
Figure 44E:
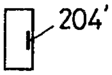
Figure 44C:
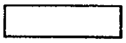
Figure 46:
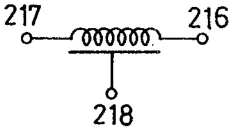
FIG. 46 is an equivalent circuit diagram of the LC composite part shown in FIG. 45.

As can be seen from FIGS. 39 and 43, the electronic part of the invention includes the electrodes 203, 215 and coil-forming conductive patterns 202, 210, 213 formed close to each other, and therefore capacitance is provided between them and a desired value of capacitance is easily obtained to an advantage by changing the length of the electrodes 203, 215 and their distance from the coil-forming conductive patterns. Also, as shown, the conductive patterns combinedly form a coil as they are connected end to end so as to spiral continuously from the space between a particular pair of insulator layers to another between-the-insulator space. Consequently, the composite electronic part according to the invention gives an equivalent circuit as represented in FIG. 46 and hence is utilizable as a filter element, for example. With the foregoing construction the invention provides the varieties of advantages described above.

FIG. 47 through 63 illustrate two embodiments of laminated transformers.

FIGS. 47 through 53 illustrate a laminated transformer according to the eighth embodiment of the present invention and the sequence of fabricating the same for embodying the invention. First, a base film of polyethylene terephthalate or the like (not shown) is prepared, and an insulator layer 301 of magnetic material or the like in the form of a thin sheet (film) is either deposited on by printing or stuck fast to the base. The term "printing" as used herein means the formation of a thin layer of magnetic or other insulator, conductive pattern, or the like by the printing technique. By "sheeting" is meant the process of laminating insulator layers preformed by the sheet-forming method.

Figure 47:
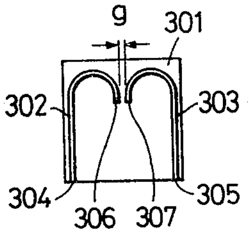
FIGS. 47 through 52 are plan views showing a sequence of steps for fabricating a laminated transformer according to the eighth embodiment of the invention.
Figure 48:
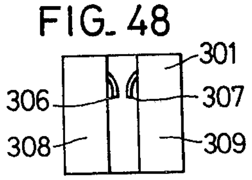
Figure 49:
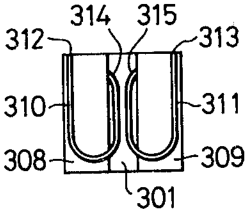
Figure 50:
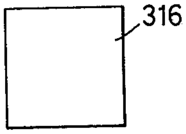
Figure 51:
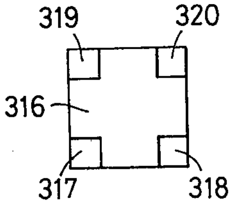
Figure 52:
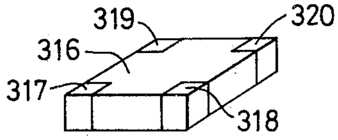
Figure 53:
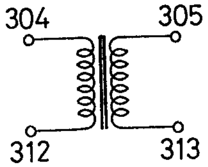
FIG. 53 is an equivalent circuit diagram of the first embodiment of laminated transformer.

FIG. 47 shows an insulator layer. On the surface of this insulator layer are deposited by printing a pair of coil-forming patterns 302, 303 of an electrically conductive material in the form of hooks. The conductive patterns 302, 303 extend downwardly as viewed in the figure, terminating at ends 304, 305 flush with the lower edge of the insulator layer 301 of magnetic material, while their inner ends 306, 307 like the tips of hooks are located close to each other. The gap g between the inner ends 306 and 307 is suitably chosen depending on the coupling coefficient k of the objective laminated transformer. The fabrication proceeds to the step illustrated in FIG. 48, where rectangular insulator layers 308, 309 are formed as laminations by sheeting or printing on the underlying conductive patterns and insulator layer. The hook ends 306, 307 of the conductive patterns are left exposed for subsequent use as connections. Next, as shown in FIG. 49, another pair of coil-forming conductive patterns 310, 311 are printed. These patterns are generally U-shaped each and are disposed in parallel with the inner sides close to each other. Their inner ends 314, 315 overlap the corresponding ends 306, 307 of the underlying patterns, thus forming connections, and their outer ends 312, 313 extend to the upper edge of the laminated structue. As will be obvious from the description up to this point, the conductive patterns 302, 310 are a first combination or set which forms a continuous spiral pattern constituting a first coil, and likewise the patterns 303, 311 form a second set which constitutes a second coil. The both ends of the two coils are exposed on the lower and upper edge faces of the laminate. Although the number of laminations described is limited for the sake of simplicity, it is to be unerstood that the fabrication steps illustrated in FIGS. 47 to 49 may be repeated the number of times required to achieve the end without departing from the spirit and scope of the invention. Thus, as indicated in FIG. 50, the surface of the resulting laminate is entirely covered with an insulator layer 316 by sheeting or printing. Finally, as already explained in connection with FIG. 37, the whole multilayer structure may contain a number of unit laminates built up in the manner as exemplified thus far and may be cut into individual laminates, each of which exposing the ends 304, 305 and 312, 313 of the sets of conductive patterns, respectively, on the lower and upper edge faces. The individual laminates thus obtained are sintered in a sintering furnace to integral chip-shaped multilayer products in which the layers or laminations are solidly bonded together. Next, as shown in FIGS. 51 and 52, silver paste or the like is applied or printed on each laminate to form terminal electrodes 317, 318, 319, 320 connected with the ends 304, 305, 312, 313 of the conductive patterns inside, and the terminal electrodes, in turn, are baked securely to the laminate at an appropriate temperature. It will be clear to those skilled in the art that the laminated transformer thus completed has an equivalent circuit as represented in FIG. 53.

Figure 54:
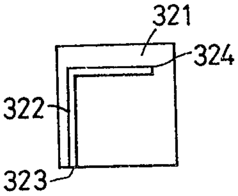
FIGS. 54 through 63 are plan views showing a sequence of steps for fabricating a laminated transformer according to the ninth embodiment of the invention.
Figure 55:
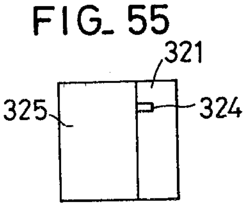
Figure 56:
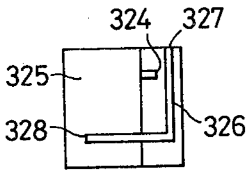
Figure 57:
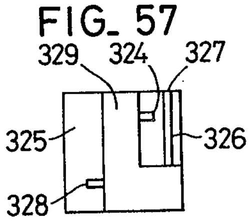
Figure 58:
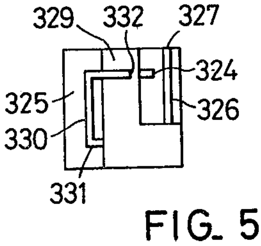
Figure 59:
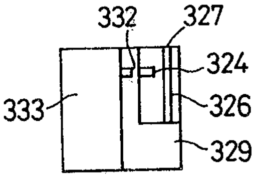
Figure 60:
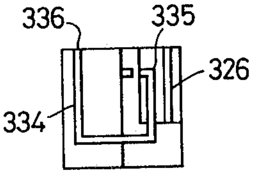
Figure 61:
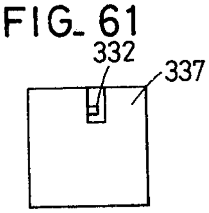
Figure 62:
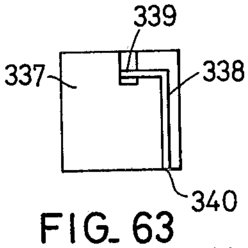
Figure 63:
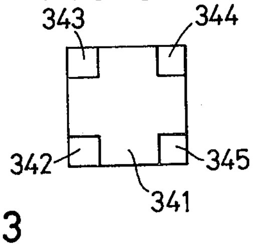

Another (nineth) embodiment of the laminated transformer of the invention will now be described. To begin with, a conductive pattern 322 to form a portion of the first coil is printed in the form of an inverted letter L over an insulator layer 321 formed by printing or sheeting as shown in FIG. 54. One end 323 of the conductive pattern 322 is exposed on the lower edge face of the insulator layer 321, and the inner end terminates with a connection 324. In the following step of FIG. 55, more than the left half of the insulator layer 321 and the conductive pattern except for the connecting end 324 are covered by another insulator layer 325 by sheeting or printing. Then, as FIG. 56 shows, a conductive pattern 326 to form a portion of the second coil is printed in the form of a turned letter L, away from the connecting end 324. At this point of time, one end 327 of the conductive pattern 326 is exposed flush with the upper edge face of the insulator layer 321, while the inner end of the pattern terminates with a connection 323. Next, the middle portion of the conductive pattern 326 is covered, in the manner shown in FIG. 57, by an insulator layer 329 formed by printing or sheeting, and an L-shaped, second-coil-forming conductive pattern 330 as shown in FIG. 58 is printed. This conductive pattern terminates with a connecting end 331 overlapping the connecting end 328 of the underlying conductive pattern 326 and also with an inner connecting end 332. As FIG. 59 shows, an insulator layer 333 is deposited by printing or sheeting, leaving only the connecting end 332 of the pattern 330 uncovered, followed by printing of a generally U-shaped conductive pattern 334 to form a portion of the first coil as in FIG. 60. One end of the pattern 334 overlaps the connecting end 324 of the underlying pattern 322 forming a portion of the first coil, and the other end 336 is exposed on the upper edge face of the laminate. The entire surface of the laminate, with the exception of the connecting end 332 of the second-coil-forming pattern, is covered with an insulator layer 337 by sheeting or printing as indicated in FIG. 61, and an additional conductive pattern 338 is printed as in FIG. 62. One connecting end 339 of this pattern 338 overlaps the connecting end 332 of the underlying pattern, and the other end 340 of the final pattern is extended flush with the lower edge face of the laminate. Then as shown in FIG. 63, an insulator layer 341 is formed by sheeting or printing over the surface of the laminate. Upon lamination to this stage, the entire multilayer structure of a much larger surface area than the laminate described immediately above that constitutes but one section is cut, and those parts are sintered in a sintering furnace to obtain monolithic sintered parts. Each of the sintered laminates shows the ends 323, 336 of the first-coil-forming conductive patterns and the ends 327, 340 of the second-coil-forming conductive patterns exposed on the upper end lower edge faces, and then terminal electrodes 342, 343, 345 are connected to those exposed ends by baking. The outward appearance of each laminated transformer thus completed is as shown in FIG. 63 and is analogous to what is shown in FIG. 52 as the eighth embodiment of the invention.

The laminated chip-shaped electronic parts according to the present invention are small and monolithic in construction. A large number of the laminated inductors or the like can be simultaneously manufactured by integral operation of printing and sheeting processes and therefore stability in quality is ensured and mas production is made possible. The small, chip-shaped laminated electronic parts have advantages in point of assembly, including the ease of mounting on a printed circuit board or other similar substrate.

It should be understood that variations and modifications of the laminated electronic parts according to the present invention can be easily inferred for those skilled in the art without departing from the spirit of the present invention.

What we claimed is:

1. An electronic part including at least one inductor, which comprises a plurality of superposed electrically conductive segmental coil turns having interconnection portions and being partially separated from one another by interposed sheets of electrically insulating magnetic ferrite, said sheets formed to expose said interconnection portions so that said segmental coil turns are interconnected by said interconnection portions to form one or more coils, said coils being superposed on one another in a direction substantially normal to the surfaces of said insulating sheets and being terminated by sheets of electrically insulating magnetic ferrite at both ends of the part, said electronic part being finally formed by sintering said magnetic ferrite.

2. An electronic part according to claim 1, wherein said electrically conductive segmental coil turns are formed from heat-resistant metal.

3. An electronic part according to claim 2, wherein said heat-resistant metal is a member of the group consisting of Pd and Pd-Ag.

4. An electronic part according to claim 1, wherein said electronic part further includes at least one electrode layer formed adjacent to at least one of said segmental coil turns to provide at least one capacitor.

5. An electronic part according to claim 1 wherein two terminals are attached to said end terminating sheets of insulating magnetic ferrite and disposed to contact the segmental coil turns positioned adjacent to said end terminating insulating sheets whereby circuit contacts are provided for said inductor.

6. An electronic part according to claim 5, wherein said electronic part further includes at least one electrode layer formed adjacent to at least one of said segmental coil turns to provide at least one capacitor.

7. An electronic part according to claim 6, wherein said at least one electrode layer forms a capacitor between said at least one electrode layer and at least one of said segmental coil turns.

8. A process for fabricating an electronic part including at least one inductor, which comprises forming a first layer of an insulating magnetic ferrite, (b) printing a first electrically conductive segmental coil turn having an interconnecting portion on said first ferrite layer, (c) printing a second layer of insulating magnetic ferrite on said first layer and all but said interconnecting portion of said first segmental coil turn, (d) printing a second electrically conductive segmental coil turn having an interconnecting portion on said second layer of insulating magnetic ferrite positioned to connect with said interconnecting portion of said first segmental coil turn, (e) printing a third layer of insulating magnetic ferrite on said second layer and all but said interconnecting portion of said second segmental coil turn, (f) repeating steps (b) through (e) until a desired number of layers is reached, (g) forming a final layer of an insulating magnetic ferrite, and (h) firing the resulting layered body.

9. A process for fabricating an electronic part according to claim 8, wherein said process further comprises the step of coating said fired layered body with at least two thin terminals contacting the ends of said segmental coil turns.

10. A process for fabricating an electronic part according to claim 8 or 9 wherein said process further comprises the step of forming at least one electrode adjacent to said first or second segmental coil turn during the performance of step (b) or step (d) to provide at least one capacitor coupled to said at least one inductor.

* * * * *